(12) United States Patent
Webb et al.

(10) Patent No.: US 7,075,721 B2
(45) Date of Patent: Jul. 11, 2006

(54) COMPENSATOR FOR RADIALLY SYMMETRIC BIREFRINGENCE

(75) Inventors: James E. Webb, Fairport, NY (US); John H. Bruning, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/379,248

(22) Filed: Mar. 4, 2003

(65) Prior Publication Data

US 2003/0168597 A1   Sep. 11, 2003

Related U.S. Application Data

(60) Provisional application No. 60/362,234, filed on Mar. 6, 2002.

(51) Int. Cl.
  *G02B 5/30* (2006.01)
  *G02B 27/28* (2006.01)

(52) U.S. Cl. .................. 359/499; 359/494; 359/497; 359/351; 359/352; 359/355

(58) Field of Classification Search ............... 359/499, 359/494, 489, 900, 498, 371, 386, 497, 351, 359/352, 355; 355/67, 95, 53
See application file for complete search history.

(56) References Cited

U.S. PATENT DOCUMENTS

| | | | |
|---|---|---|---|
| 6,252,712 B1 * | 6/2001 | Furter et al. ............. | 359/499 |
| 6,278,549 B1 * | 8/2001 | Gaebe .................... | 359/584 |
| 2003/0128349 A1 * | 7/2003 | Unno ...................... | 355/67 |

FOREIGN PATENT DOCUMENTS

WO    WO 00/75697 A1    12/2000

OTHER PUBLICATIONS

"Birefringence of CaF2", K. Nattermann, and S. Glass, Calcium Fluoride Birefringence Workshop, Jul. 18, 2001.
"Intrinsic Birefringence Impact On The ASML Wilton 157nm Lens", B. Tirri, and M. Albert, Calcium Fluoride Birefringence Workshop, Jul. 18, 2001.
"Lens Design Software Code V® Modification", C. VanPeski, Calcium Fluoride Birefringence Workshop, Jul. 18, 2001.
"Intrinsic Birefringence Workshop", J. Webb, Calcium Fluoride Birefringence Workshop, Jul. 18, 2001.
"Influence of the Intrinsic Birefringence in F2 Projection System", A. Suzuki and Y. Unno, Calcium Fluoride Birefringence Workshop, Jul. 18, 2001, San Francisco, CA.
"Intrinsic Birefringence in 157 nm Materials", J,H, Burnet, Z.H. Levine and E.L. Shirley, Calcium Fluoride Birefringence Workshop, Jul. 18, 2001, San Francisco, CA.

(Continued)

*Primary Examiner*—Drew A. Dunn
*Assistant Examiner*—Joshua L. Pritchett
(74) *Attorney, Agent, or Firm*—Timothy M Schaeberle

(57) ABSTRACT

A birefringence correction is incorporated into an optical imaging system for imaging with deep ultraviolet light. Optical elements which exhibit an intrinsic birefringence with deep ultraviolet light are arranged in a fashion that renders accumulated birefringence less sensitive to the angular orientation of the beam's rays around the optical axis. A compensating optic corrects a residual radially symmetric component of the birefringence.

15 Claims, 5 Drawing Sheets

OTHER PUBLICATIONS

" Consensus builds behind 157-nm microlithography", R.W. Hardin, Reports Technology and Trends for the International Optical Engineering Community, No. 194, Feb. 2000.

"The Development of 157nm Small Field and Mid-field MicroSteppers", R..E. Miller, P. Bischoff, R. Sumner, S. Bowler, W.W. Fkack, and G. Fong, SPIE 2000, #4000-174, pp. 1-12.

"Hidden in plain sight: Calcium Fluoride's Intrinsic Birefringence", J.H. Burnett, Z.H. Levine, and E.L. Shirley, Photonics Reports,www.Photonics.com, Dec. 2001.

"Materials problem snags 157-nm lithography", D. Lammers, EE Times, Jul. 10, 2001, pp. 1-3.

"Metrology Supporting Deep Ultraviolet Lithography", ww.eeel.nist.gov, pp. 1-5.

"Minimizing spatial-dispersion-induced birefringence in crystals used for precision optics by using mixed crystals of materials with the opposite sign of the birefringence", J. Burnett, Z. Levine, and E. Shirley, NIST, Nov. 8, 2001, pp. 1-2.

"Current Status of Nikon's Inventigation on CaF2 Intrinsic Birefringence", N. Shiraishi, S. Owa, Y. Ohmura, T. Ozawa, and I. Tanaka, Calcium Fluoride Birefringence Workshop, Jul. 18, 2001, pp. 1-15.

"Simulation of Intrinsic Birefringence of CaF2 in Code B®", T. Walker, Calcium Fluoride Birefringence Workshop, Jul. 18, 2001.

"Intrinsic Birefringence in CaF2", C.Zeiss and D. Krahmer, Calcium Fluoride Birefringence Workshop, Jul. 18, 2001.

* cited by examiner

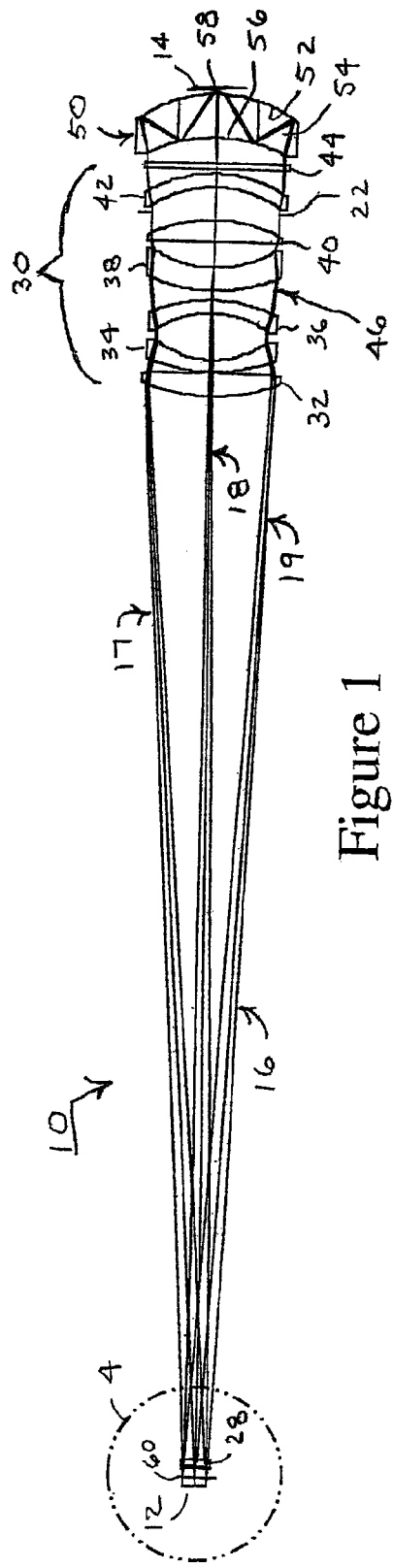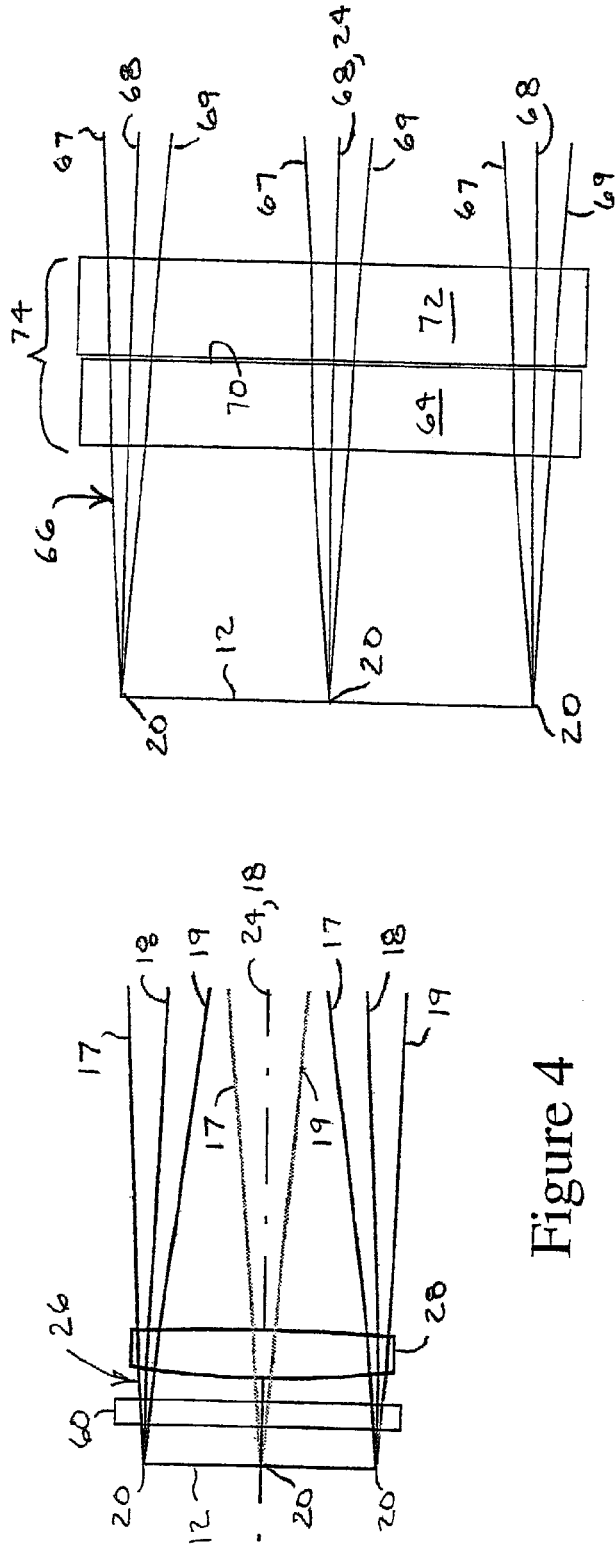
Figure 1
Figure 4
Figure 5

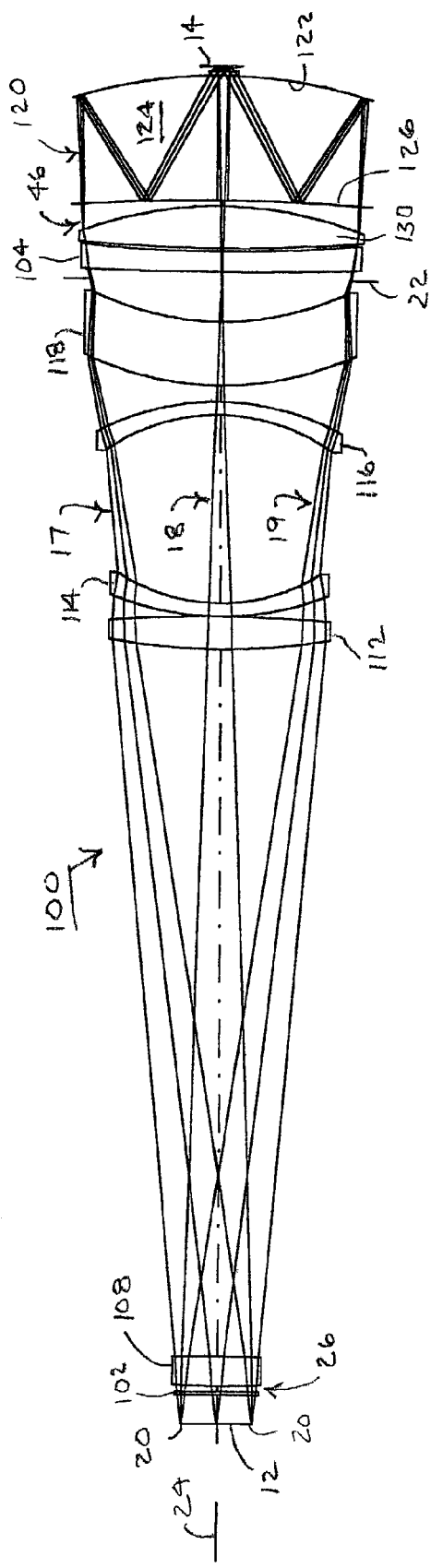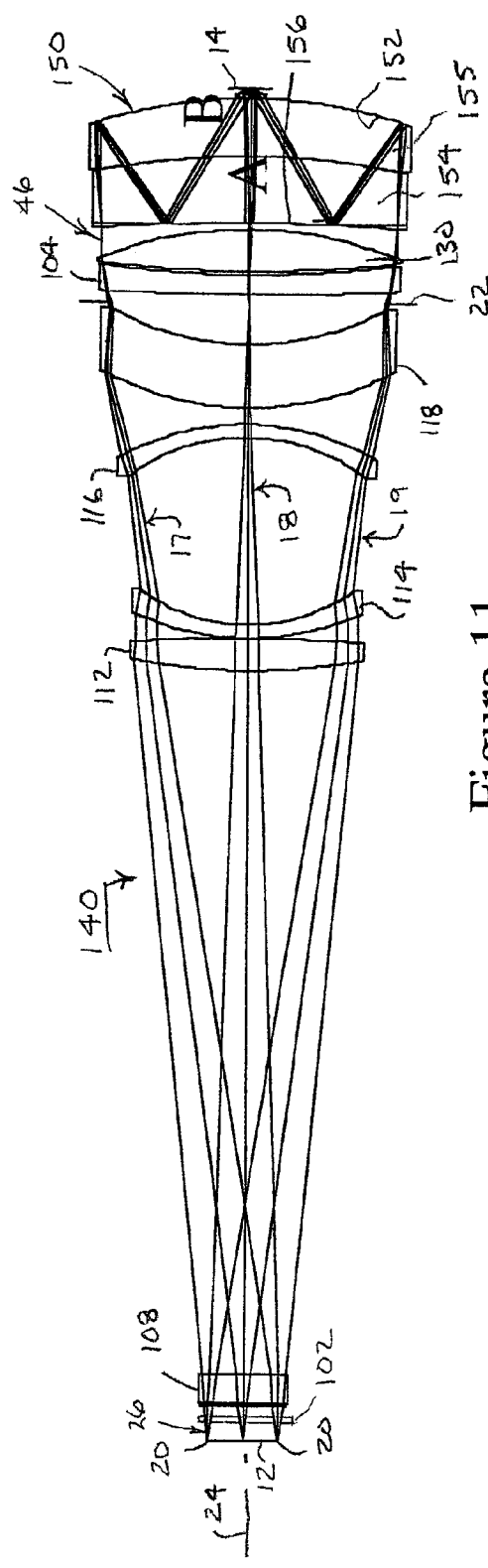
Figure 10
Figure 11

COMPENSATOR FOR RADIALLY SYMMETRIC BIREFRINGENCE

This application claims the benefit of U.S. Provisional Application No. 60/362,234, filed on Mar. 6, 2002, which provisional application is incorporated by reference herein.

TECHNICAL FIELD

Imaging with deep-ultraviolet light using available crystalline optical materials requires correcting or otherwise dealing with issues of intrinsic birefringence that become more pronounced at shorter wavelengths in the vicinity of 157 nanometers.

BACKGROUND

Microlithographic manufacturing systems and microscopic inspection systems continue to evolve for imaging smaller and smaller feature sizes. Ultimately, the minimum feature size depends upon the wavelength of the illumination. Shorter wavelengths are required for smaller feature sizes. Imaging systems now successfully operate at wavelengths as small as 193 nanometers, but the next generation of microlithographic imaging is expected to operate at even smaller wavelengths of around 157 nanometers. Microscopic inspection systems are also being developed to operate at the smaller wavelengths.

Not many materials have appropriate optical characteristics for producing images at wavelengths of light within the deep-ultraviolet spectrum near 157 nanometers in wavelength. The most promising candidate is calcium fluoride ($CaF_2$), which has a cubic crystalline structure. However, calcium fluoride ($CaF_2$) has been found to exhibit an intrinsic birefringence at 157 nanometer wavelengths. No birefringence is evident for light rays normal to the crystal's {111} planes; but rays with angular departures, which involve transmissions through other planes (e.g., {110}, {101}, and {011} planes), produce birefringence that increases at different rates in different directions. Peak birefringence is apparent in three evenly spaced directions, which is referred to as "three-fold symmetry".

A number of solutions have been proposed to avoid or reduce the intrinsic birefringence. Some work is underway mixing crystalline materials with opposite birefringence, such as mixing barium fluoride ($BaF_2$) with calcium fluoride, to produce a compound crystalline structure that is free of birefringence through a range of directions. Another approach assembles optical elements made of different materials having opposite signs of intrinsic birefringence for diminishing cumulative effects of birefringence.

A single birefringent material (e.g., calcium fluoride) has also been proposed for use among multiple optics that are relatively varied in angular orientation around an optical axis to balance the effects of birefringence in different directions. This procedure is referred to as clocking. For example, the peak birefringence of calcium fluoride occurs in three evenly spaced directions around the axis of the (111) plane. Successive optics can be arranged with their (111) plane's axis aligned with a common optical axis but each angularly rotated by different amounts around the common optical axis (i.e., clocked) to evenly distribute the directionally sensitive birefringence. Similar clocking effects can be achieved by orienting other of the crystal's planes, such as the crystal's {001} or {110} planes, normal to the optical axis and rotating successive optics by different amounts around the optical axis.

Imaging systems containing optics made from amorphous materials can also exhibit similar birefringence effects, particularly where light rays depart significantly from the optical axis, such as in systems with high numerical aperture. Such birefringence is generally evenly distributed around the optical axis.

SUMMARY OF THE INVENTION

In this invention, we primarily address the problem of radially symmetric birefringence but also provide capabilities for addressing higher orders of birefringence. Generally, we prefer to convert the directionally sensitive birefringence (e.g., three-fold symmetry) typical of cubic crystal materials, such as calcium fluoride ($CaF_2$), into a predominantly radially symmetric birefringence for correction. Our corrective optics can be located within a telecentric space or within a pupil space and are specially adapted to exploit beam characteristics in the two locations to remove unwanted radially symmetric or other forms of birefringence.

Our preferred deep-ultraviolet imaging system for operating at wavelengths in the range of 157 nanometers is a catadioptric imaging system in which most of the required focusing power is provided by a double-reflecting Mangin mirror. Light traveling through additional lens elements required for completing the imaging function (e.g., correcting aberrations) undergoes little bending to avoid accumulating much birefringence. Most of the birefringence of our preferred imaging system is generated by one or more transmissive elements between reflective surfaces of the Mangin mirror. However, transmissions between the reflective surfaces can be arranged to perform a clocking function that more evenly distributes the birefringence around the optical axis.

Both the transmissive element of the Mangin mirror and the additional lens elements can be made of a cubic crystalline material such as calcium fluoride ($CaF_2$) oriented with one of the crystal's {111} planes normal to a common optical axis. Light rays passing through the low-power lens elements acquire little birefringence. The higher angle transmissions of rays through the transmissive element of the Mangin mirror accumulate much more birefringence, but the transmissions are rotated (i.e., clocked) with respect to each other to more evenly distribute the accumulated birefringence around the optical axis.

Angular departures of the light rays from the axis of the (111) plane produce the most pronounced birefringence in three polar angle directions around the common optical axis. The separation between the pronounced directions of birefringence is 120 degrees. Reflections within the Mangin mirror rotate the illuminating beam through 180 degrees, which is equivalent to clocking each pass by an odd multiple of 60 degrees.

Although not reducing birefringence per se, the Mangin mirror converts an angularly clustered birefringence around the optical axis into a more evenly distributed birefringence around the optical axis. The converted birefringence is a more radially symmetric birefringence. As seen in an exit pupil, the magnitude of the converted birefringence increases as a function of radial distance (offset) from the optical axis, but the magnitude of the accumulated birefringence remains relatively constant as a function of polar angle orientation around the optical axis.

A compensating optic made from a material that itself exhibits radially symmetric birefringence, but of opposite sign, can be used to reduce the remaining radially symmetric birefringence. Single axis crystal materials, such as sapphire, magnesium fluoride ($MgF_2$), and lanthanum fluoride ($LaF_3$), which are too birefringent to be used as lens elements, can be fashioned as compensating optics within a telecentric or near telecentric portion of the object or image space. The symmetric axes of the single crystals are oriented parallel or nearly parallel to the optical axis. The highly birefringent single-axis materials can be used as compensating optics for correcting birefringence produced at larger angles of departure by much lower birefringent materials. The more rapid correction made possible by the use of highly birefringent materials also allows the compensating optics to be more limited in thickness, which limits their attenuation.

Single-axis crystalline materials are preferred for use as radially symmetric compensating optics in telecentric space (including near telecentric space) because the birefringence of such crystals is particularly sensitive to inclination angles of passing rays (e.g., cone angle) but is not particularly sensitive to radial offset of the same rays from the optical axis. In other words, the compensating optic has an angular-dependent birefringence effect but has a limited offset-dependent birefringence effect.

The insensitivity to radial offset allows the angular-dependent compensating optic to take a planar or other regular form within telecentric space (including near telecentric space). The chief rays of object/image points, which by definition pass through the center of an aperture stop, extend substantially parallel to each other in telecentric space but are offset from the optical axis in accordance with the positions of the object/image points in their respective object or image plane. Accordingly, radially symmetric birefringence can be corrected in telecentric space using an angular-dependent compensating optic that is insensitive to the radial offsets of the chief object/image point rays.

A regularly shaped compensating optic can also correct for radially symmetric birefringence in telecentric space that departs small amounts from absolute telecentricity. The departure from telecentricity is apparent as a slight inclination of the chief rays of the object/image points, along with a corresponding angular imbalance among their attendant marginal rays. In an axial plane of incline, one marginal ray increases in inclination while the opposite marginal ray decreases in inclination. The birefringence effects associated with the difference in inclination can be compensated for by varying the path lengths of the marginal rays through the angular-dependent compensating optic. The amount of birefringence experienced by the passage of any single ray through the angular-dependent compensating optic is a function of both the ray's inclination with respect to the crystal axis and the ray's path length through the crystal. Such path length variations can be made by varying the thickness of the compensating optic as a function of radial distance from the optical axis. The thickness variation can take a simple spherical or aspherical form, such as a surface of revolution, to compensate for small departures from telecentricity while providing an overall radially symmetric birefringence compensating effect.

Preferably, the angular-dependent compensating optic operating within telecentric (including near telecentric) object or image space is located within a slowly converging or diverging cone of light (i.e., a low numerical aperture) approaching a minimum aperture dimension. For example, in a reducing system such as a microlithographic imaging system, the angular-dependent compensating element is preferably positioned near the object plane (e.g., near the reticle) at the origin of a slowly diverging cone of light. At smaller diameters, the single-axis crystal materials exhibiting the required corrective birefringence are more readily available and have a lower cost. The slow divergence of the marginal rays (i.e., the rays most affected by birefringence) limits ray splitting by the highly birefringent single-axis crystals between ordinary and extraordinary polarization directions that are differentially affected by the birefringence.

The angular-dependent compensating optic can also be arranged to compensate for small misalignments of crystal axes with respect to the optical axes of the optical elements (e.g., lenses or transmissive element of the Mangin mirror). For example, small errors in the identification of the crystal axes during the manufacture of the lens elements can result in the production of lens elements with crystal axes that are tilted with respect to their optical axes. The compensating element can be manufactured with its crystal axis intentionally mis-aligned with respect to its optical axis to at least partially undo the effects of similar misalignments of the lens elements.

A compensating optic for reducing radially symmetric birefringence can also be located at or near a pupil of a telecentric system, where the chief rays of the object/image points approach (i.e., converge toward or diverge from positions close to) the optical axis through orientations that are variously inclined to the optical axis. Both angular-dependent compensating optics (similar to the compensating optics proposed for use in telecentric space) and offset-dependent compensating optics can be used in pupil space depending on angular relationships among and between the marginal and chief rays. The birefringence compensation of offset-dependent compensating optics increases with radial distance of passing rays from the optical axis, but the birefringence compensation does not significantly vary with inclination of the same rays to the optical axis. Amorphous materials, such as fluorine-doped fused silica, with induced stress can be used for this purpose. Such amorphous materials are generally more abundant in larger sizes than single-axis crystal materials.

The pupil space is preferably associated with a low-power portion of the imaging system in advance of the aperture stop where an increased focal length at a correspondingly enlarged aperture diameter minimizes angles of convergence between the chief rays as well as between corresponding marginal rays from the different object points. As a result, the useful pupil space extends to either side of the aperture stop encompassing much of the low-power portion of the imaging system.

In addition to minimizing the angles of convergence between the corresponding rays of different object points, the average inclinations of the marginal rays with respect to the chief rays can be adjusted to minimize or maximize the birefringence effects of an angular-dependent compensating optic. If the average inclination of the marginal rays with respect to the chief rays is considerably more than the angles of convergence between corresponding rays, then an angular-dependent compensating optic can be used in pupil space to produce a radially symmetric birefringence effect. However, if the average inclination of the marginal rays is comparable the convergence angles between corresponding rays, then an angular-dependent compensating optic would not be effective for correcting radially symmetric birefringence.

In either instance, however, an offset-dependent compensating optic can be located in pupil space to produce a radially symmetric birefringence effect. Regardless of the angles through which light rays reach the pupil space, the rays are offset from the optical axis in accordance with their initial angular departure from the optical axis in the telecentric space. Corresponding marginal rays in telecentric space emanating from different object points converge to the same positions within the pupil space. In other words, rays that are inclined by the same amount in telecentric space converge to common points in pupil space in positions that are offset from the optical axis in accordance with their degree of inclination. Accordingly, an offset-dependent compensating optic can be used to cancel radially symmetric birefringence in pupil space by exhibiting a birefringence sensitivity to offset over inclination angle similar to the effect of an angular-dependent compensating optic within telecentric space exhibiting a birefringence sensitivity to inclination angle over offset.

Additional and more complex birefringence compensating effects can be achieved within the pupil space by varying the stress or form thickness of either type of compensating optic. Compound effects can be achieved by using both an angular-dependent and an offset-dependent compensating optic within the pupil space. For example, simple spherical or aspherical curvature of the offset-dependent compensating optic can be used to further vary the amount of birefringence produced at different radial distances from the optical axis. The desired birefringence at each radial position within the pupil space is achieved by adjusting the thickness of the offset-dependent compensating optic as a function of radial distance from the optical axis, where increased thickness produces more birefringence compensation.

Non-radial thickness adjustments can also be made to either type of compensating element to reduce any remaining asymmetric birefringence within the pupil space. The further compensating effect can be accomplished by adjusting thickness as a function of polar angle orientation around the optical axis. In addition, more complex stress profiles beyond those required for producing a symmetric offset-dependent effect could be used to compensate for any remaining non-radially symmetric birefringence.

A combined correction for largely radially symmetric birefringence can be obtained by locating compensating elements in both telecentric space and pupil space. The compensating optic located in telecentric space preferably produces an angular-dependent birefringence effect with little offset dependence, and the compensating optic located in pupil space preferably produces an offset-dependent birefringence effect with little angular dependence. Thickness variations and stress can be added to either or both of the angular-dependent and offset-dependent compensating optics to produce more refined corrections. For example, simple radially dependent thickness variations of the angular-dependent compensating optic can be made to compensate for slight departures from telecentricity. Similar thickness variations of the offset-dependent compensating optic can be made to scale the radial birefringence effect. Higher order thickness variations can be made to the offset-dependent compensating optic to compensate for any remaining non-radially symmetric components of the birefringence. Stresses can also be added to produce similar higher order effects.

Although the compensating optics of our invention are generally arranged to reduce birefringence effects accumulated by imaging systems, a small amount of birefringence may be desirable to compensate for subsequent polarization sensitivities, such as in the photoresist layer of the wafer substrates. For example, a small amount of radially symmetric birefringence as measured in the pupil could be effective to compensate for polarization sensitivities in the photoresist that are more pronounced with increasing angles of incidence.

DRAWINGS

FIG. 1 is a diagram of a catadioptric imaging system in which optical components accumulate a substantially radially symmetric birefringence and in which an angular-dependent compensating optic is located within a telecentric space of the imaging system for canceling the accumulated radially symmetric birefringence.

FIG. 4 is a schematic view of the angular-dependent compensating optic in telecentric space showing the passage of parallel chief rays that are variously offset from the optical axis in accordance with the distribution of object points in a preceding reticle. Associated marginal rays diverge slowly from their common object points in the reticle.

FIG. 5 is an schematic view of the angular-dependent compensating optic modified to accommodate small departures from telecentricity while producing an overall radially symmetric birefringence effect.

Figure 7:
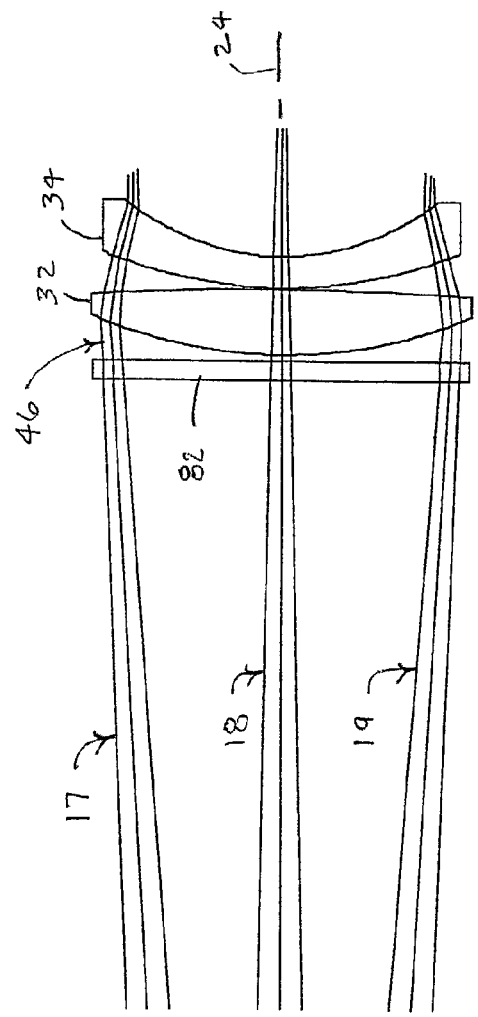

FIG. 7 is schematic view of the offset-dependent compensating optic in the pupil space showing the approach of chief rays to the optical axis through orientations that are variously inclined to the optical axis. Corresponding marginal rays that are similarly relatively inclined approach points that are radially offset in the pupil space in accordance with their angular inclination in the telecentric space.

Figure 8:
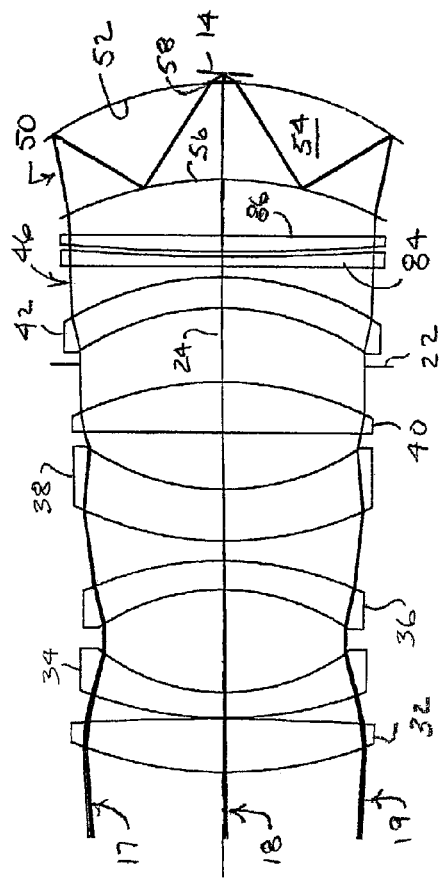

FIG. 8 is schematic view of the offset-dependent compensating optic modified by a radial-dependent thickness variation to adjust its radially symmetric birefringence effect.

Figure 9:
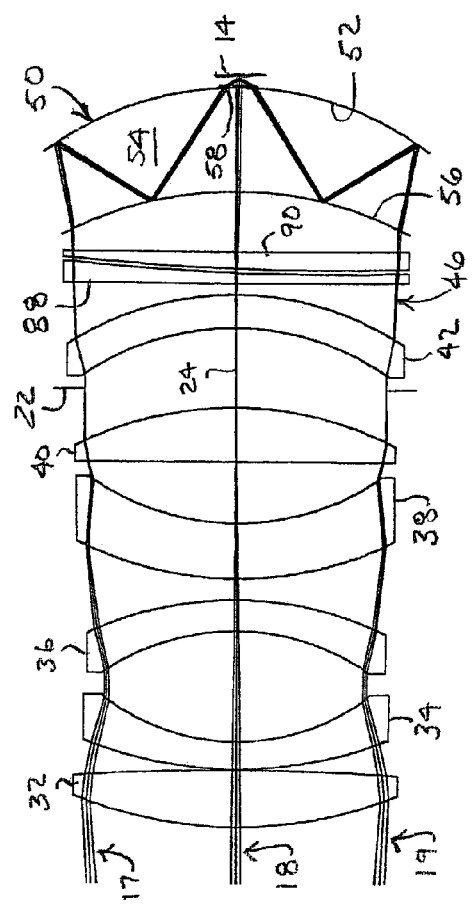

FIG. 9 is a schematic view of the offset-dependent compensating optic modified by an polar angle-dependent thickness variation to provide a non-radially symmetric birefringence effect.

FIG. 10 is a diagram of another catadioptric imaging system in which optical components accumulate a substantially radially symmetric birefringence and in which both an angular-dependent compensating optic is located within a telecentric space of the imaging system and an offset-dependent compensating optic is located within a pupil space of the imaging system for canceling the accumulated birefringence. A double-reflecting Mangin mirror is arranged with a nominally planar partially reflective surface to balance the inclination of internally reflected rays with respect to the optical axis.

Figure 3:
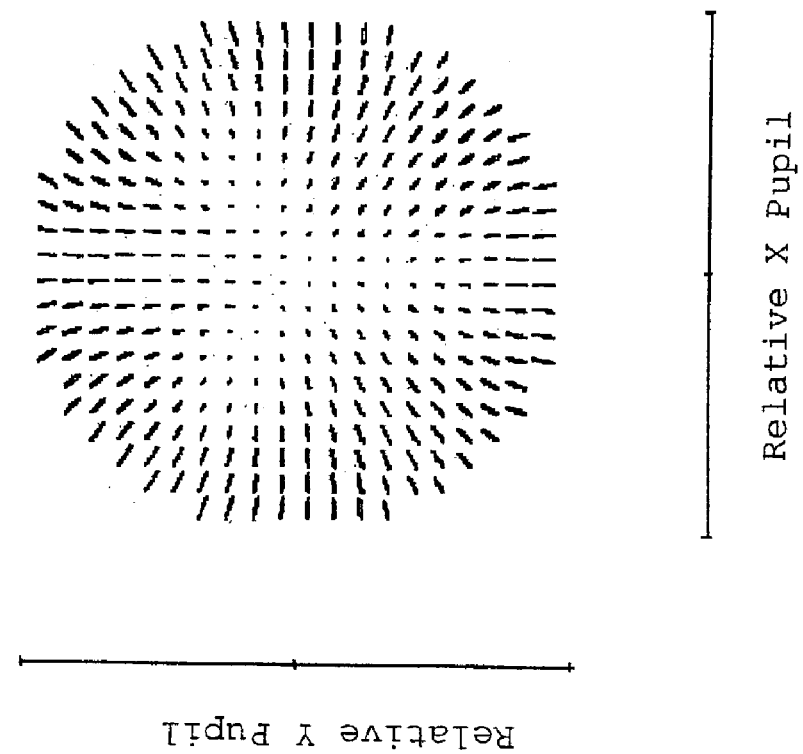
FIG. 3 shows a more uniform (radially symmetric) distribution of the birefringence produced by combining the birefringence produced by a total of three passes through the double-reflecting Mangin mirror.

FIG. 11 is diagram of another catadioptric imaging system arranged similar to the system of FIG. 10 but containing optics having a different crystal orientation and a modified double-reflecting Mangin mirror in which a transmissive element is split and relatively rotated to convert a four-fold distribution of birefringence into a more uniform (radially symmetric) distribution of birefringence similar to that shown in FIG. 3.

DETAILED DESCRIPTION

A catadioptric imaging system 10 especially useful for microlithography at deep-ultraviolet wavelengths near 157 nanometers is laid out in FIG. 1 beginning with the illumination of a reticle 12 (an object plane) and ending with the imaging of the reticle 12 in a reduced form onto a photoresist layer of a wafer substrate 14 (an image plane). A beam 16 of the ultraviolet light containing information about the reticle 12 is initially captured in a telecentric form (see also FIG. 4) by the imaging system 10, which directs chief rays 18 from object points 20 on the reticle 12 through the center of an aperture stop 22. An optical axis 24 extends between the reticle 12 and the wafer substrate 14 passing through the center of the aperture stop 22 as a reference axis for aligning components of the imaging system 10.

Within a telecentric space 26 of the imaging system 10, the chief rays 18 of the object points 20 extend substantially parallel to the optical axis 24 in positions that are variously offset from the optical axis 24. The beam 16 after passing through the reticle 12 remains in the telecentric space 26 for a limited distance after a focusing optic 28 that redirects the chief rays 18 on gradually converging paths toward the center of the aperture stop 22. The beam 16 itself, including marginal rays 17 and 19, continues to gradually diverge to fill the aperture stop 22.

A lens group 30, including focusing optics 32, 34, 36, 38, 40, and 42 and correction plate 44, directs the beam 16 through a pupil space 46 containing the aperture stop 22. Within the pupil space 46 of the imaging system 10, the chief rays 18 of the object points 20 approach the optical axis 24 through orientations that are variously inclined to the optical axis 24. Corresponding marginal rays 17 or 19 of the different object points 20 converge toward common points within the pupil space 46 in positions that are offset from the optical axis 24 in accordance with the degree of inclination of the corresponding rays 17 or 19 in the telecentric space 26.

All of the optics 32, 34, 36, 38, 40, 42, and 44 of the lens group 30 are preferably made of a single crystal material such a calcium fluoride (CaF$_2$). Other cubic crystals that might also be used for constructing the optics of the lens group 30 include barium fluoride (BaF$_2$) and strontium fluoride (SrF$_2$). The calcium fluoride (CaF$_2$) crystal material is preferably oriented with one of its <111> axes aligned with the common optical axis 24 of the optics in the lens group 30. Light rays traveling parallel or nearly parallel to the optical axis 24 acquire little of the birefringence effect that becomes more pronounced at larger angles of departure. The optics of the lens group 30 exhibit very little optical power (i.e., little bending of the light rays toward or away from the optical axis). Therefore, only a small amount of birefringence is accumulated by the passage of the light beam 16 through the lens group 30.

The focusing optic 28 together with the focusing optics 32, 34, 36, 38, and 40 constitute a front group of optics in advance of the aperture stop 22 responsible for establishing a focal length, which together with the numerical aperture of the beam 16 entering the imaging system 10, sets a diameter of the aperture stop 22. The long focal length apparent from FIG. 1 provides for converging corresponding chief rays 18 as well as corresponding marginal rays 17 or 19 of the object points 20 through minimum angles with respect to each other. In the vicinity of the aperture stop 22 where the corresponding rays intersect, significant radial divergence of the corresponding rays 17, 18, or 19 is not apparent from before the focusing optic 32 until the beam 16 enters the Mangin mirror 50. Accordingly, the pupil space 46 within which the corresponding rays 17, 18, or 19 approximately overlap extends well to either side of the aperture stop 22.

A double-reflecting Mangin mirror 50 receives the beam 16 in a nearly collimated form but reflects the beam 16 from a curved reflective surface 52 on a converging path through a transmissive element 54 that is also preferably made of a single crystal material such as calcium fluoride (CaF$_2$). Alternatives include barium fluoride (BaF$_2$) and strontium fluoride (SrF$_2$). A partially reflective surface 56 re-reflects the beam 16 on a further converging path back through the transmissive element 54, exiting the Mangin mirror 50 through an aperture 58 in the curved reflective surface 52. The converging beam 16 exiting the Mangin mirror 50 produces a reduced image of the reticle 12 onto the photoresist layer of the wafer substrate 14.

Figure 2:
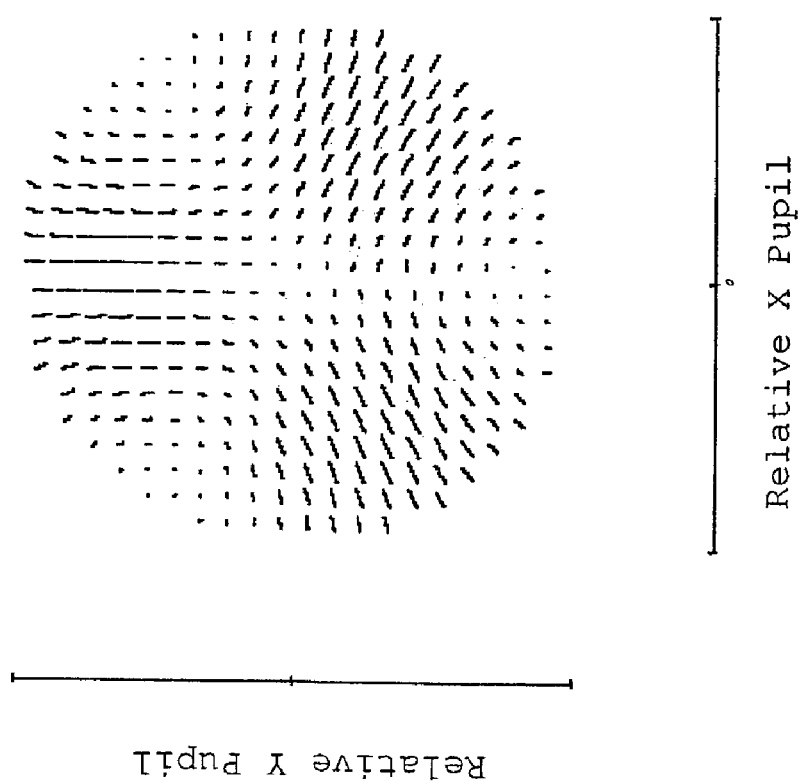
FIG. 2 shows a three-fold distribution of the birefringence produced by a single pass through a double-reflecting Mangin mirror of the catadioptric imaging system.

The two reflections of the Mangin mirror 50 provide a significant reduction in the image size together with a corresponding increase in numerical aperture. However, the beam 16 and particularly marginal rays 17 and 19 of the beam 16 traverse the transmissive element 44 at considerable angular departures from the optical axis 24. Significant birefringence accumulates with each pass, as exemplified for one such pass in FIG. 2. Within the pupil field shown in FIG. 2, birefringence increases at different rates in different directions around the optical axis 24. The distribution of the birefringence in the field is illustrated by an array of line segments each oriented to a local direction of most rapid change in birefringence within the field and each sized in length in accordance with a local magnitude of the birefringence within the field. Peak birefringence is apparent in three evenly spaced directions, which is referred to as "three-fold symmetry".

Each of the reflections from the reflective surfaces 52 and 56 of the Mangin mirror inverts the beam 16, which is equivalent to a 180-degree rotation of the beam 16. Since the three-fold symmetry occurs at 120 degree intervals, the 180 degree rotation of the beam 16 distributes the peak birefringence at 60 degree intervals that overlap to produce a more evenly distributed birefringence around the optical axis 14 as shown in FIG. 3. The main component of the accumulated birefringence from both the lens group 30 (including the focusing optic 28) and the Mangin mirror 50 is a radially symmetric birefringence.

Although the birefringence contributed by the lens group 30 is much less than the birefringence contributed by the Mangin mirror 50, the optical elements 32, 34, 36, 38, 40, 42, and 44 of the lens group 30 can be relatively rotated (i.e., clocked) around the optical axis 24 to distribute the birefringence more uniformly around the optical axis 24. In addition, the optical elements of the lens group 30 can be made with other of their crystal axes, such as their <001> axes, aligned with and clocked about the optical axis 24 to further angularly distribute birefringence around the optical axis 24. Four-fold symmetry is apparent in the alternative <001> crystal axes orientations.

In the illustrated embodiment of FIGS. 1 and 4, our invention provides an angular-dependent compensating optic 60 within the telecentric space 26 to cancel or otherwise correct the accumulated radially symmetric birefringence. The angular-dependent compensating optic 60 is preferably made of a single-axis crystal material, such as sapphire, oriented to exhibit an angular-dependent birefringence effect opposite in sign to the radially symmetric birefringence accumulated from the focusing optic 28, the lens group 30, and Mangin mirror 50. Other exemplary materials for the angular-dependent compensating optic 60 include magnesium fluoride ($MgF_2$), lanthanum fluoride ($LaF_3$), and crystalline quartz.

As shown in FIG. 4, the angular-dependent compensating optic 60 is located between the reticle 12 and the focusing optic 28 within a portion of the telecentric space 26. The chief rays 18 from the object points 20 extend substantially parallel to the optical axis 24 in positions that are variously offset from the optical axis 24 in accordance with the positions of the object points 20 in the object plane of the reticle 12. The marginal rays 17 and 19 emanating from each of the object points 20 define uniform cones of light centered about their associated chief rays 18.

The angular-dependent compensating optic 60 produces a birefringence compensating effect that increases with the inclination of passing rays to the optical axis 24. Accordingly, the marginal rays 17 and 19 of each object point 20 acquire considerably more birefringence compensation than their associated chief rays 18 (which acquire little or none). However, the angular-dependent compensating optic 60 is relatively insensitive to the radial offset of the chief and marginal rays 18 and 17 and 19 from the optical axis. Neither the chief rays 18 nor the marginal rays 17 and 19 acquire significant birefringence on account of their offset (i.e., radial distance from the optical axis). Thus, each of the light cones of the object points 20 is treated nearly equally with the marginal rays 17 and 19 of each cone acquiring more birefringence compensation than the chief rays 18 of each cone.

The radially symmetric birefringence effect of the angular-dependent compensating optic 60 can be scaled by adjusting the overall thickness of the angular-dependent compensating optic 60 to cancel the radially symmetric birefringence produced by the focusing element 28, the lens group 30, and the Mangin mirror 50. The birefringence effect of the angular-dependent compensating optic 60 is a function of both the angular inclination of passing rays to its crystal axis and the distance traversed by the passing rays through its crystal material. In a true telecentric space 26 where the chief rays 18 extend parallel to the optical axis, the angular-dependent compensating optic 60 can take the form of a plane-parallel plate for producing a radially symmetric birefringence compensating effect.

The single-axis materials preferred for this purpose are highly birefringent to produce the required compensating effect at low cone angles (i.e., at the relatively low angular departures of the marginal rays 17 and 19 from the optical axis 24 in the telecentric space 26 in comparison to the much higher angular departures of the same rays through the Mangin mirror 50) and at limited thicknesses. The low cone angles limit ray splitting between different polarization directions. The limited thickness of the angular-dependent compensating optic 60 reduces attenuation of the beam 16. The location of the angular-dependent compensating optic 60 adjacent to reticle 12 within the telecentric space 26 minimizes the required diameter of the compensating optic 60. The beam 16 is at its smallest aperture dimension adjacent to the reticle 12. Single-axis crystal materials are more readily available in the smaller sizes.

A modified angular-dependent compensating optic 64 is shown in FIG. 5 for use in a telecentric space 66 where chief rays 68 from the object points 20 depart slightly from parallel to the optical axis 24. The tipping of the chief rays 68 along slightly converging or diverging paths is accompanied by a slight imbalancing of the marginal rays 67 and 69 to the optical axis 24. The amount of the imbalance increases with the offset (i.e., radial distance) of the chief rays 68 from the optical axis 24.

The slight departure from telecentricity can be compensated for by varying the thickness of the angular-dependent compensating optic 64 as a function of radial offset from the optical axis 24. One of the surfaces 70 of the angular-dependent compensating optic 64 can take the form of a sphere or other surface of revolution to balance the birefringence between the chief ray 68 and the marginal rays 67 and 69 emanating from different object points 20. The angular imbalance between the marginal rays 67 and 69 of any one object point 20 is compensated for by varying the relative distances traversed by the same marginal rays 67 and 69 through the angular-dependent compensating optic 64. Higher order thickness variations can be made to produce different compensating effects among light cones from the different object points 20. Stresses can also be applied to produce similar effects.

Although the thickness variation of the angular-dependent compensating optic 64 produces a more radially symmetric compensating effect in the slightly departed telecentric space 66, the thickness variation also produces a small aberration in the beam 16 that is independent of polarization. The aberration is at least partly undone by a mating lens element 72 that forms a doublet 74 with the angular-dependent compensating optic 64. The mating lens element 72 can be made of calcium fluoride or other transmissive material that exhibits a much more limited birefringence effect than the angular-dependent compensating optic 64. The small birefringence produced by the mating lens element 72 is included in the accumulated birefringence cancelled by the angular-dependent compensating optic 60.

Figure 6:
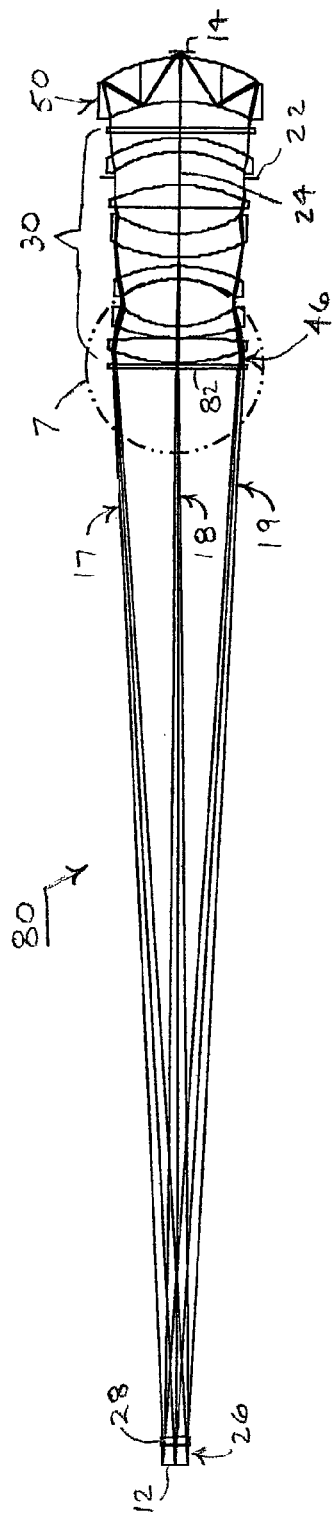
FIG. 6 is a diagram of a similar catadioptric imaging system in which optical components accumulate a substantially radially symmetric birefringence and in which an offset-dependent compensating optic is located within a pupil space of the imaging system for canceling the accumulated radially symmetric birefringence.

A similar catadioptric imaging system 80 is shown in FIG. 6. The same reference numerals denote corresponding structures between the imaging systems 10 and 80. However, an offset-dependent compensating optic 82 within the pupil space 46 replaces the angular-dependent compensating optic 60 within the telecentric space 26. The birefringence compensation provided by the offset-dependent compensating optic 82 (see also FIG. 7) increases with the radial offset of the rays 17, 18, and 19 from the optical axis 24 but does not significantly vary with the inclination of the same rays 17, 18, and 19 to the optical axis 24.

The offset-dependent compensating optic 82 is preferred for use within the pupil space 46 of the present embodiment over an angular-dependent compensating optic, because the average radial offset between the chief rays 18 and the marginal rays 17 and 19 is more pronounced than an average angular difference between the chief rays 18 and the marginal rays 17 and 19. In addition, materials for making offset-dependent compensating optics are more readily available at the larger diameter aperture of the pupil space 46. Fluorine-doped fused silica under appropriate stress is preferred for this purpose. The stress can be added during the formation of the offset-dependent optic (e.g., during quenching or tempering) or as an external force (e.g., mechanical or thermal) applied in situ.

FIGS. 8 and 9 depict alternative modified offset-dependent compensating optics 84 and 88 located within another portion of the pupil space 46 for scaling or otherwise further refining the intended birefringence compensating effect. Both of the offset-dependent compensating optics 84 and 88 are associated with respective mating lens elements 86 and 90 to at least partially undo any wavefront aberrations produced by surface modifications of the offset-dependent compensating optics 84 and 88. The mating lens elements 86 and 90 are preferably made of a material, such as calcium fluoride, similar to the rest of the imaging system 10 to minimize the addition of any more birefringence.

The modified offset-dependent compensating optic 84 is exemplary of thickness modifications that take the form of surfaces of revolution centered about the optical axis 24. In the offset-dependent compensating optic 84, thickness increases with radial distance (offset) from the optical axis 24. The increased thickness adds path length through the offset-dependent compensating optic 84 for increasing the birefringence compensating effect. Accordingly, the thickness variation of the offset-dependent compensating optic 84 illustrated in FIG. 8 increases the birefringence compensation as a function of radial distance from the optical axis 24.

The modified offset-dependent compensating optic 88 is exemplary of thickness modifications that are not symmetric about the optical axis 24. In the offset-dependent compensating optic 88, thickness varies with polar angle position around the optical axis. The thickness variation can range from a simple wedge to multiple lobes. For example, a sinusoidal variation in thickness with polar angle orientation around the optical axis 24 could be used to remove any residual three-fold symmetry that is not evenly distributed around the optical axis. Additional stress modifications to the offset-dependent compensating optic 88 can be used to produce similar effects.

An angular-dependent compensating optic can be substituted for any one of the offset-dependent compensating optics 82, 84, or 88 and achieve similar birefringence compensation to the extent that the marginal rays 17 or 19 are on average inclined to the optical axis 24 by amounts substantially more than the corresponding marginal rays 17 or 19 are inclined to each other. A long combined focal length of the optics in advance of the aperture stop 22 reduces the inclination of the marginal rays 17 or 19 with respect to each other. A combination of positive and negative focusing optics can be used to adjust the average inclination of the marginal rays 17 or 19 with respect to the chief rays 18 at a location within the pupil space 46.

An alternative catadioptric imaging system 100 is shown in FIG. 10. Where possible, corresponding reference numerals have been used to designate structures in common with the preceding imaging systems 10 and 80. However, several differences are evident beginning with the addition of both an angular-dependent compensating optic 102 within the telecentric space 26 and an offset-dependent compensating optic 104 within the pupil space 46. The two compensating optics 102 and 104 preferably cooperate to remove not only radially symmetric birefringence but also other forms of birefringence compensation that are not radially symmetric, such as compensation for the residual birefringence generated by three-fold symmetry.

A modified configuration of lens elements 108, 112, 114, 116, and 118 precedes the aperture stop 22 for use with a modified double-reflecting Mangin mirror 120. Similar to the Mangin mirror of the preceding embodiments, the Mangin mirror 120 includes a curved reflecting surface 122 and a partially reflective surface 126 formed on either side of a transmissive element 124. However, the partially reflective surface 122 of the Mangin mirror 120 is planar or substantially planar to better balance the two high angle reflections through the Mangin mirror. The nominally planar partially reflective surface 126 is expected to reduce ray-splitting effects associated with reflections from curved partially reflective surfaces.

The angular-dependent compensating optic 102 is arranged similar to the angular-dependent compensating optics 60 or 64 of the imaging system 10 to cancel radially symmetric birefringence. The offset-dependent compensating optic 104, while similar to the offset-dependent compensating optics 82, 84, or 88 of the imaging system 80, is intended to make finer corrections to any remaining radial or non-radial birefringence. Curvature is illustrated for this purpose, but stress could also be used. The offset-dependent compensating optic 104 can also contribute to reducing radially symmetric birefringence.

A mating lens element 130 is paired with the offset-dependent compensating optic 104 to undo any aberrations caused by the surface modifications to the offset-dependent compensating optic 104. In addition, the mating lens element 130 performs a focusing function within the imaging system 100.

The crystal axis (e.g., <111> axes) of either of the compensating optics 102 or 104 in this or other of the preceding embodiments can be slightly inclined to the optical axis 24 to compensate for corresponding inclinations of the crystal axes of other of the optics within the imaging systems. The inclination of angular-dependent compensating optics 60, 64, or 102 changes the effective inclination of passing rays to the crystal axis on either side of the tilt axis. The inclination of the offset-dependent compensating optics 82, 84, 88, or 104 changes the effective offset of passing rays from the center of the optics on either side of the tilt axis.

Generally, stressed amorphous materials are preferred for making offset-dependent compensating optics and single-axis crystals are preferred for making angular-dependent compensating optics, but appropriately modified crystals and amorphous materials can be used for either purpose. In addition, thin films, particularly beam-splitting films, can be arranged to exhibit birefringence. For example, beam-splitting films deposited onto curved surfaces can be used to provide a radially symmetric birefringence effect.

Another alternative catadioptric imaging system 140 is shown in FIG. 11 featuring an alternative double-reflecting Mangin mirror 150 that is modified to accommodate a different crystal orientation to the optical axis 24. With the exception of a different crystal axis orientation, the other elements of the imaging system 140 match the elements of the preceding imaging system 100. The same reference numerals are used to denote the matching elements.

The Mangin mirror has a reflecting surface 152 and a partially reflecting surface 156 similar to the Mangin mirror 120 but has a pair of mating transmissive elements 154 and 155 that are relatively rotated (i.e., clocked) with respect to each other. Both of the transmissive elements 154 and 155 are made of a cubic crystal material such as calcium fluoride ($CaF_2$) and oriented with one of their <001> axes aligned with the optical axis 24. Birefringence exhibited by so oriented cubic crystals peaks at 90-degree intervals around the optical axis. Accordingly, the 180-degree beam rotations associated with reflections from the reflective surfaces 152 and 156 do not further distribute birefringence within the 90-degree intervals.

However, by splitting the transmissive portion of the Mangin mirror into two mating transmissive elements 154 and 155, one of the transmissive elements can be rotated (i.e., clocked) with respect to the other around the optical axis to more evenly distribute birefringence around the optical axis. The remaining low-power focusing elements 108, 112, 114, 116, 118, and 130 are also preferably oriented with one of their <001> axes aligned with the optical axis 24. Although the birefringence contributed by the remaining low-power focusing elements 108, 112, 114, 116, 118, and 130 is small in comparison to the birefringence produced by the converging reflections within the Mangin mirror 150, the remaining focusing elements 108, 112, 114, 116, 118, and 130 can be clocked relative to each other or to either of the two mating transmissive elements to further distribute the birefringence in a radially symmetric form.

The two compensating elements 102 and 104 perform similar compensating functions for removing the radially symmetric birefringence. However, surface or stress modifications can be used to remove any residual four-fold birefringence that is not evenly distributed around the optical axis.

Although the birefringence intended for correction from telecentric or pupil space has so far been referenced to a pupil plane, birefringence patterns evident in the image plane on the wafer substrate 14 can also be corrected from the two locations. For example, the chief rays 18 and associated marginal rays 17 and 19 from the object points 20 are spatially separated in the telecentric space 26. Accordingly, birefringence effects associated with different points in the image plane can be corrected by making birefringence modifications to the light cones associated with their corresponding object points 20.

To the extent a more fundamental radially symmetric birefringence effect is still required, an angular-dependent birefringence compensating optic could still be used but in a modified form to produce different birefringent effects among the ray cones associated with different object points 20. Thickness variations or stress could be used for this purpose. If image plane birefringence corrections alone are needed, then an amorphous material differentially stressed is preferred for making the correction within the telecentric space 26. However, if the birefringence pattern in the image plane happens to be radially symmetric, then an offset-dependent compensating optic can be used within the telecentric space to make the correction.

Within the telecentric space 26, the image plane corrections for birefringence can be made most accurately by locating the required compensating optic as close as possible to the reticle (i.e., the object plane). Here, the ray cones associated with different object points project at their smallest diameter.

Image field corrections for birefringence can also be made within the pupil space 46, particularly corrections requiring radial symmetry. To achieve such symmetries, the beam 16 should be collimated within the telecentric space 46. The marginal rays 17 and 19 associated with the on-axis object point 20 should extend parallel to the optical axis 24 within the pupil space 46. The marginal rays 17 and 19 associated with all other of the object points 20 are variously inclined to the optical axis 24 in the pupil space 46 by amounts corresponding to the radial offset of the same object points 20 in the object plane.

Accordingly, an angular-dependent compensating optic can be used within the pupil space 46 to correct a radially symmetric birefringence in the image plane, such as a birefringence that increases with radial distance from the optical axis 24. Stress, form curvature, and other beam modifications can be used to correct other patterns of birefringence in the image plane.

Additional details of catadioptric imaging systems that can be readily adapted to the purposes of the subject invention can be found in co-owned U.S. Pat. No. 5,650,877, entitled Imaging System for Deep Ultraviolet Lithography, which is hereby incorporated by reference. Our invention is also applicable to optical inspection systems and other optical imaging systems operating particularly within the deep ultraviolet spectrum and requiring birefringence correction.

We claim:

1. An optical imaging system for producing images with deep-ultraviolet light comprising:
    an arrangement of optical elements aligned along a common optical axis and exhibiting with respect to a beam of deep-ultraviolet light an intrinsic birefringence that varies with both inclination of the beam's rays to the optical axis and angular orientation of the beam's rays around the optical axis;
    the optical elements being arranged with respect to the beam of deep-ultraviolet light in a progression that renders an accumulated birefringence less sensitive to the angular orientation of the beam's rays around the optical axis; and
    a compensating optic exhibiting a radially symmetric birefringence in a sense opposite to the accumulated birefringence so that together with the arrangement of optical elements, the accumulated birefringence of the beam of deep-ultraviolet light is reduced with respect to both the inclination of the beam's rays to the optical axis and the angular orientation of the beam's rays around the optical axis,
    wherein the compensating optic is located within a telecentric object space in which chief rays of object points extend substantially parallel to the optical axis in positions that are variously offset from the optical axis.

2. The imaging system of claim 1 in which the compensating optic is an angular-dependent compensating optic exhibiting a birefringence effect that is particularly sensitive to the inclination of the beam's rays to the optical axis but is relatively insensitive to radial offset of the beam's rays from the optical axis.

3. The imaging system of claim 2 in which the angular-dependent compensating optic is made of a crystal material.

4. The imaging system of claim 2 in which the angular-dependent compensating optic is located within the telecentric object space in a position between an object imaged by the imaging system and the progression of optical elements that are aligned along a common optical axis.

5. The imaging system of claim 2 in which a thickness of the angular-dependent compensating optic is varied as a function of radial distance from the optical axis.

6. The imaging system of claim 5 in which the thickness variation of the angular-dependent compensating optic compensates for small departures of the chief rays from orientations parallel to the optical axis.

7. The imaging system of claim 1 in which the compensating optic is an offset-dependent compensating optic exhibiting a birefringence effect that is particularly sensitive to radial offset of the beam's rays from the optical axis but is relatively insensitive to inclination of the beam's rays to the optical axis.

8. The imaging system of claim 7 in which the offset-dependent compensating optic is made of a stressed amorphous material.

9. The imaging system of claim 7 in which the offset-dependent compensating optic is located within the telecentric object space in a position between an object imaged by the imaging system and the progression of optical elements that are aligned along a common optical axis.

10. The imaging system of claim 7 in which a thickness of the offset-dependent compensating optic is varied as a function of radial distance from the optical axis to vary the amount of birefringence correction with radial position within the telecentric object space.

11. The imaging system of claim 9 in which a thickness of the offset-dependent compensating optic is varied as a function of the angular orientation around the optical axis to vary the amount of birefringence correction with angular position within the telecentric object space.

12. A system for correcting a radially symmetric component of birefringence within an optical imaging system comprising:
   an optical assembly that exhibits birefringence including a radially symmetric component of the birefringence;
   the optical assembly being arranged along an optical axis for producing an image of an object through a pupil space within which chief rays of object points approach the optical axis through orientations that are variously inclined to the optical axis;
   a compensating optic that exhibits an opposite sign of radially symmetric birefringence;
   the compensating optic being located with respect to the optical assembly in a position that substantially cancels the radially symmetric component of the birefringence exhibited by the optical assembly;
   both the radially symmetric birefringence exhibited by the compensating optic and the radially symmetric component of the birefringence exhibited by the optical assembly being centered around a common optical axis;
   the optical assembly defining a telecentric object space within which chief rays of the object points within a beam of illumination subject to the birefringence extend substantially parallel to the optical axis in positions that are variously offset from the optical axis; and
   the compensating optic being located with the telecentric object space.

13. The system of claim 12 in which the compensating optic is an angular-dependent compensating optic exhibiting a birefringence effect that is particularly sensitive to inclination of the beam's rays to the optical axis but is relatively insensitive to radial offset of the beam's rays from the optical axis.

14. The system of claim 13 in which a thickness of the angular-dependent compensating optic is varied as a function of radial distance from the optical axis.

15. The system of claim 14 in which a surface of the compensating optic subject to the thickness variation has a aspheric form.

* * * * *